United States Patent [19]

Taruno et al.

[11] Patent Number: 5,645,787
[45] Date of Patent: Jul. 8, 1997

[54] PROCESS FOR PRODUCING SEMICONDUCTOR DEVICES USING RESIN TABLETS

[75] Inventors: Tomohiro Taruno; Shinichi Kanai; Hiroyuki Asao; Syoichi Kimura; Yoshio Toyoda, all of Osaka, Japan

[73] Assignee: Nitto Denko Corporation, Osaka, Japan

[21] Appl. No.: 464,386

[22] Filed: Jun. 5, 1995

Related U.S. Application Data

[62] Division of Ser. No. 328,953, Oct. 24, 1994, which is a continuation of Ser. No. 978,439, filed as PCT/JP92/00345, Mar. 19, 1992, abandoned.

[30] Foreign Application Priority Data

| Mar. 20, 1991 | [JP] | Japan | 3-81696 |
| Dec. 6, 1991 | [JP] | Japan | 3-349648 |

[51] Int. Cl.$^6$ ............................ B29C 45/02; B29C 45/14
[52] U.S. Cl. ............................ 264/272.17; 264/328.4; 264/328.5; 264/331.12
[58] Field of Search .................. 264/272.17, 328.4, 264/328.5, 331.12; 428/80

[56] References Cited

U.S. PATENT DOCUMENTS

| 4,554,126 | 11/1985 | Sera | 264/328.5 |
| 4,963,307 | 10/1990 | Sakai | 264/272.17 |

FOREIGN PATENT DOCUMENTS

| 5631004 | 3/1981 | Japan . |
| 58-53145 | 4/1983 | Japan . |
| 59-7009 | 1/1984 | Japan . |
| 60-040214 | 3/1985 | Japan . |
| 60-251633 | 12/1985 | Japan . |
| 61-035908 | 2/1986 | Japan . |
| 61-40353 | 2/1986 | Japan . |
| 61-177210 | 8/1986 | Japan . |
| 61-270121 | 11/1986 | Japan . |
| 63-51108 | 3/1988 | Japan . |
| 63-54468 | 3/1988 | Japan . |
| 1129424 | 5/1989 | Japan . |
| 02171217 | 7/1990 | Japan . |
| 2171220 | 7/1990 | Japan . |
| 35103 | 1/1991 | Japan . |

OTHER PUBLICATIONS

JP 61–035908, Abstract #86–035808, Japan Patent Information Organization (JAPIO), Tokyo, Japan (1988).

JP 61–035908, Abstract #86–090636, Derwent, Inc., McClean, VA.

Primary Examiner—John C. Bleutoe
Assistant Examiner—D. R. Wilson
Attorney, Agent, or Firm—Sughrue, Mion, Zinn, Macpeak & Seas

[57] ABSTRACT

A resin tablet for sealing by transfer molding a semiconductor, which is obtained by cooling and solidifying a molten resin composition, is disclosed. The tablet has a compressibility of not less than 98% and a metallic impurity content of less than 50 ppm, preferably with the amount of fine powders of 250 mesh or smaller adhered thereto being controlled below 0.05% by weight based on the tablet and a water content being controlled below 0.1% by weight.

9 Claims, 3 Drawing Sheets

PROCESS FOR PRODUCING SEMICONDUCTOR DEVICES USING RESIN TABLETS

CROSS REFERENCE TO THE RELATED APPLICATION

This is a divisional of application Ser. No. 08/328,953 filed Oct. 24, 1994, which is a continuation of application Ser. No. 07/978,439, filed Nov. 18, 1992, now abandoned, which is a continuation-in-part-application of International Application No. PCT/JP92/00345, filed Mar. 19, 1992, entitled "RESIN TABLET FOR SEMICONDUCTOR SEALING, AND PROCESS FOR PRODUCING THE SAME".

FIELD OF THE INVENTION

This invention relates to resin tablets for sealing of semiconductor chips, a process for producing the same, and a process for producing a semiconductor device using the same.

BACKGROUND OF THE INVENTION

Sealing or packaging of semiconductor chips is usually carried out by transfer molding of a sealing compound. In some detail, a semiconductor chip is set in a mold cavity, and a thermosetting resin tablet preheated usually by radiofrequency induction heating is put in a transfer pot. The tablet is plasticized by heating and, at the same time, pressed by a plunger and introduced into the cavity through a sprue, a runner, and a gate to complete shaping and curing.

Resin tablets for this use have conventionally been produced by cold compression molding comprising plasticizing and kneading raw materials in a roll or an extruder, cooling the resin compound, pulverizing the solidified resin compound, feeding a prescribed given amount of the powder to a mold, and compressing the powder into a tablet between an upper plunger and a lower plunge at room temperature. Tablets obtained by this plunger-plunger compression molding suffer from considerable incorporation of metallic impurities due to the metal wear during pulverization, which has made it difficult to obtain high purity tablets. Besides, the tablets suffer from noticeable void formation.

While moldability of conventional resin tablets for sealing of semiconductors essentially depends on physical properties of the resin used, it is largely influenced by impurities in the tablets, particularly metallic impurities. The quantity of heat generated by radiofrequency induction heating during preheating of tablets is expressed by $\omega V^2 \epsilon \tan \delta$, wherein $\omega$ is a frequency; $V$ is an applied voltage; and $\epsilon$ is a dielectric constant of the tablet. Because dielectric constant $\epsilon$ of resins ranges from 4 to 5 while that of metals is substantially unlimited, the parts where metallic impurities are present undergo abnormal heating and thereby excessive curing. In some cases, sparks occur in such parts to cause excess current to pass through the induction heater, which often causes troubles of the induction heater. Even where transfer molding is not preceded by radiofrequency induction heating, semiconductor devices sealed with a resin compound containing metallic impurities are inferior in reliability. Therefore, resin tablets containing metallic impurities are unfavorable for use as a semiconductor sealing compound.

Further, conventional tablets have many voids. Since $\epsilon$ of air in the voids is smaller than that of the resin, heating unevenness occurs due to the voids. Since a resin viscosity ($\eta$) logarithmically changes with resin temperature (T) as is seen from equation: $\eta=10^{(A+\kappa T)}$, the above-described heating unevenness develops unevenness of fluidity of the sealing resin during transfer molding, likely causing defective molding.

On the other hand, sheet-extrusion has been proposed for production of tablets for semiconductor sealing, in which raw resin materials are plasticized and kneaded in an extruder, and the extruded sheet is rolled and then punched out or cut to obtain tablets. According to this process, too, incorporation of metallic impurities inescapably occurs during the punching or cutting operation. Also, the resulting tablets contain voids generated during kneading and therefore have a compressibility (hereinafter defined) of about 90% at the highest. Further, the extrusion technique has difficulty in obtaining a thick sheet, resulting in a failure of obtaining tablets with a high L/D ratio (hereinafter defined). Furthermore, tablets obtained by punching have poor precision in shape and weight. Thus, the sheet-extrusion is unsuited for production of resin tablets for semiconductor sealing as desired.

It has been suggested to cast a molten resin composition into a metallic mold followed by tableting. However, generally having a high viscosity, the resin composition used tends to form large voids. The large voids have great influences particularly in the production of tablets having a high L/D ratio.

A molding method comprising filling a molten resin composition into a mold with an injection pressure applied, followed by tableting has been attempted. However, this method encounters with extreme difficulty in obtaining tablets having a compressibility of 98% or higher because of such a low pressure applied as injection pressure. There is found no report of using the tablet obtained under pressure on the level of injection pressure for semiconductor sealing.

SUMMARY OF THE INVENTION

An object of the present invention is to provide a resin tablet for semiconductor sealing, which has a reduced metallic impurity content and a reduced entrapped air void.

Another object of the present invention is to provide a resin tablet for semiconductor sealing, which has reduced adhesion of fine powders.

A further object of the present invention is to provide a resin tablet for semiconductor sealing, which can be uniformly preheated by radiofrequency induction heating without causing sparking.

A still further object of the present invention is to provide a process for producing the above-described resin tablet.

A yet further object of the present invention is to provide a semiconductor device using the above-described resin tablet as a sealing compound.

The above objects of the present invention are accomplished by a resin tablet obtained by cooling a molten resin composition to solidify and having a compressibility (C) of not less than 98% and a metallic impurity content of less than 50 ppm, preferably less than 20 ppm, and more preferably less than 10 ppm. It is preferable that the resin tablet according to the present invention has the amount of fine powders adhered thereon controlled below 0.05% by weight. It is also preferable that the resin tablet has a water content of less than 0.1% by weight.

DETAILED DESCRIPTION OF THE INVENTION

Figure 1:
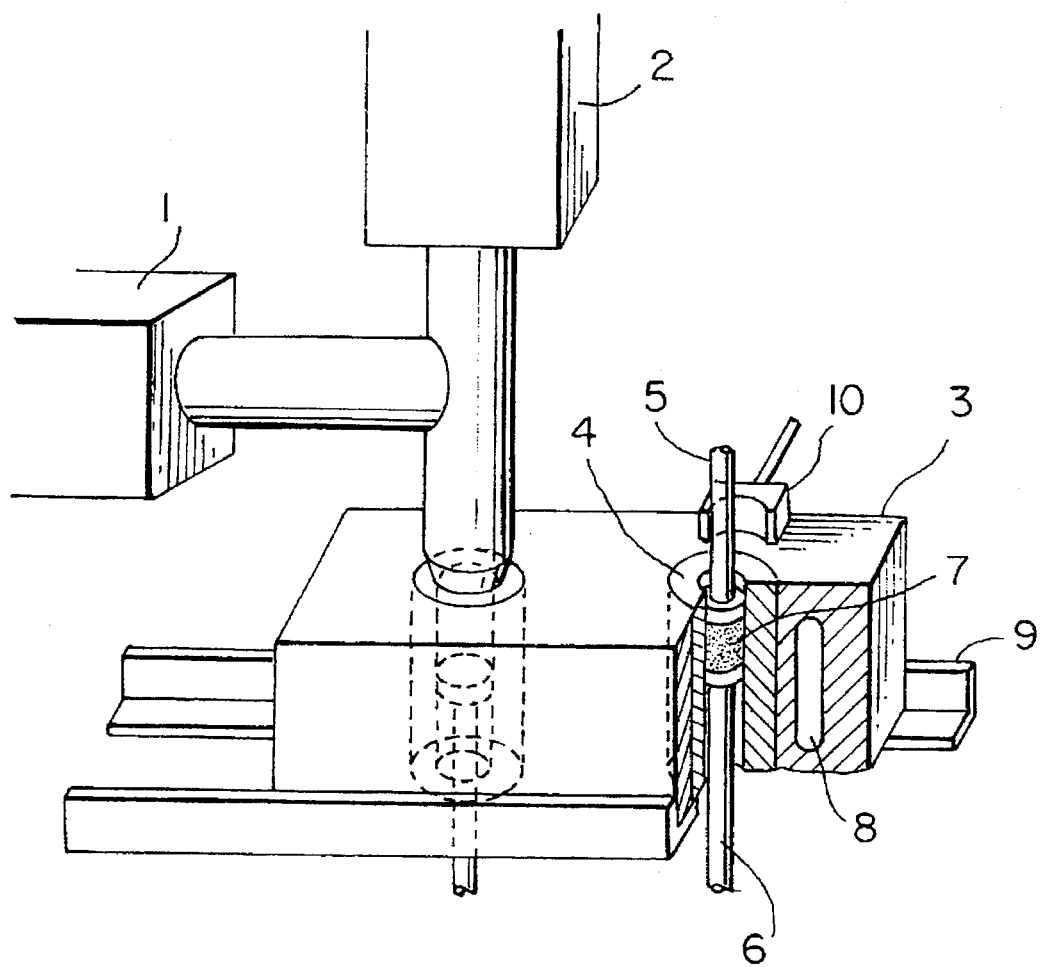
FIGS. 1 through 4 each is an explanatory view showing an example of an apparatus used to produce the resin tablets for semiconductor sealing according to the present invention.

The terminology "metallic impurities" as used herein substantially means metals per se. Metallic compounds, such as metal oxides, are not included in "metallic impurities" as referred to. The metallic impurity content can be measured with a magnetic analyzer, e.g., "TMA-01" manufactured by Tatsumori K.K.

The terminology "compressibility C" as used herein means ratio of actual specific gravity of a tablet with voids to theoretical specific gravity of a tablet with no void.

The compressibility C can be calculated from:

$$C(\%) = [(W/\rho)/V] \times 100$$

wherein $\rho$ is a specific gravity of a resin tablet cured product, V is a volume of a tablet, and W is a weight of a tablet. The resin tablet cured product can be obtained by completely curing (for example, conditions of 175° C. and 10 minutes) the resin tablet with a transfer molding machine under a pressure of 200 kg/cm².

The terminology "L/D ratio" as used herein means a length to outer diameter ratio of a tablet.

While tablets having an L/D ratio reaching 20, usually ranging from 1 to 5 are obtainable, preferred embodiments of the tablets according to the present invention include those having an outer diameter D of not more than 20 mm and an L/D ratio of not less than 1; those having a D of not less than 20 mm and an L/D ratio of not more than 1; those composed of a plurality of tablets, laminated by adhesion or fusion, each having a D of not less than 20 mm and an L/D ratio of not more than 1; and hollow tablets having an outer diameter D of not less than 20 mm and an inner diameter of not more than 20 mm.

The resin tablets of the present invention can be produced by a process comprising feeding a molten resin composition to a tableting mold and molding the composition while applying a pressure. The resin composition may be melted in a kneading extruder, and the molten composition is fed to a tableting mold under the extrusion pressure. The molten resin feeding pressure may be made constant by means of a shock absorber.

The resin composition temperature fed to the mold usually ranges from about 80° to 120° C., and the mold temperature usually ranges from 5° to 50° C.

Regarding the time for applying pressure, short time is required when the mold temperature for molding is low, and long time is required when the mold temperature for molding is high. However, the time is generally from 20 seconds to 5 minutes. The mold to be used is preferably equipped with a cooling means using a coolant (generally warm water) so that the individual tablets are cooled from their surface toward the inside. In this case, the gel time of the resulting tablet gradually decreases from the surface toward the inside of the tablet. The tablet at the time of removal from mold usually has a surface temperature of 50° C. or lower. The pressure applied during molding usually ranges from about 50 to 300 kg/cm², and preferably about 100 kg/cm² or higher.

With the metallic impurity content controlled below 50 ppm, the tablets of the present invention do not cause sparking when they are preheated by radiofrequency induction heating on use, thus developing no trouble of the induction heater at all. Besides, having a compressibility of 98% or higher, the tablet has a stable dielectric constant $\epsilon$ as a whole, and the quantity of heat generated during radiofrequency induction heating $\omega V^2 \tan \delta$ becomes uniform throughout the tablet, thus stabilizing transfer molding.

Further, the metallic impurity content controlled below 50 ppm makes it possible to surely prevent ionized metallic impurities from corroding semiconductor chips sealed by the tablets. Where a water content of the tablet is controlled below 0.1% by weight, and preferably blow 0.02% by weight, ionization of the metallic impurities can be prevented, and void formation due to water content during transfer molding can be completely avoided. Thus, use of the tablets of the present invention as a sealing compound provides semiconductor devices of markedly improved reliability. The water content of a tablet can be measured by gas chromatography.

The amount of fine powders of 250 mesh or smaller adhered onto the tablet is preferably controlled below 0.05% by weight, and particularly below 0.002% by weight, so as to follow the recent trend of cleanliness of semiconductor sealing factories. The amount of fine powders adhered to a tablet can be measured by blowing off the fine powders by an air blast of 2 to 5 kg/cm² from an air gun.

Where tablets are produced by the above-mentioned preferred process in which the molten resin composition is molded while being cooled, cooling of the molten resin composition proceeds from the surface to the inside of a tablet. As a result, the inside of the tablet is exposed to a high temperature for the longer period of time, and the resulting tablet has the slightly shorter gel time accordingly.

Where a molten resin composition is fed to a mold by the extruding force of an extruder, it is possible to improve productivity by increasing the extrusion speed.

Where a feeding pressure of a molten resin composition is made constant by means of a shock absorber, quality of the resulting tablets can be prevented from varying.

The resin composition which can be used for preparing resin tablets of the present invention is conventional. It generally comprises an epoxy resin, a silicone resin, a polyimide resin, etc. as a main component and additives, such as curing agents, curing accelerators, fillers, parting agents, pigments, flame retarders, flame retardation assistants, and surface treating agents. A typical resin composition comprises 100 parts by weight of an epoxy resin, from 10 to 30 parts by weight of a flame retardation assistant, from 40 to 80 parts by weight of a curing agent, from 200 to 1900 parts by weight of a filler, from 10 to 20 parts by weight of a flame retarder, from 1 to 3 parts by weight of a parting agent, from 1 to 3 parts by weight of a pigment, from 1 to 3 parts by weight of a curing accelerator, and from 1 to 3 parts by weight of a surface treating agent.

The resin tablets of the present invention can be obtained by, for example, dry blending the above-described components in a mixer, e.g., a Henschel mixer, melt kneading the dry blend in an extruder at a temperature of from about 60° to 150° C., filling the molten resin composition having a temperature of from 80° to 120° C. in a tablet mold, applying a pressure thereto to retain its shape while cooling by, e.g., water circulating in a jacket. After completion of the cooling, the tablets are removed from the mold.

In a preferred embodiment, upper and lower plungers are set in such a manner that the mold may be opened or closed by the motion of the plungers, a molten resin composition at about 80° to 120° C. is fed to the mold kept at about 5° to 50° C., and the plungers are put in motion to apply a pressure of from about 50 to 300 kg/cm². According to this embodiment, a pressure can easily be applied to the resin composition to obtain a tablet having a high compressibility of 98% or more and a water content of less than 0.1% by weight with the amount of fine powders of 250 mesh or smaller adhered thereto being less than 0.05% by weight.

The pressure application is preferably conducted while cooling the mold. Notwithstanding the planar pressure exerted by pressure application between the inner surface of the mold and the outer surface of the resin under molding, it appears that the adhesion therebetween is reduced by cooling and, at the same time, the resin undergoes greater shrinkage on cooling than the mold because of its higher coefficient of expansion. For these reasons, the tablet can easily be removed from the mold by ejection of the lower plunger. Therefore, tapering the inner wall of the mold along its axial direction is not needed for release from mold. According to the conventional cold molding, a compression-molded tablet is ejected from the mold by means of a lower plunger. Because of large friction between the tablet surface and the inner wall of the mold, the inner wall of the mold must be tapered to make ejection from mold easier.

To the contrary, according to the process of the present invention, a tablet having substantially zero taper ($\frac{1}{200}$ at the largest) can be obtained. Therefore, the transfer pot of a transfer molding machine to be used for semiconductor sealing can be designed at a high precision, permitting of minimization of the clearance between the pot and the inner wall of the mold. As a result, entrapment of air, i.e., void formation, can be effectively prevented ultimately providing semiconductor devices of high reliability.

As previously described, cooling of the molten resin in the mold proceeds from the outer surface toward the inside. It follows that the inside part of the resin is exposed to a high temperature for the longer time to thereby have the shorter gel time.

On the other hand, when the tablet is transfer molded for semiconductor sealing, the outer surface portion of the tablet is fluidized earlier than the central portion. As a result, there is a tendency that the outer surface portion flows into the cavity the sooner, and the central portion lags behind. If the gel time of the central portion is slightly shorter than the outer surface portion, such would be effective in some cases for the cull after transfer molding to undergo curing reaction thereby preventing a molding trouble called "cull remaining".

The process for producing the tablets of the present invention will be explained by referring to the accompanying drawings.

FIG. 1 shows one example of an apparatus used to produce the resin tablet for semiconductor sealing of the present invention.

In FIG. 1, 1 is a kneading extruder. 2 is a feeder which fills resin kneaded by the kneading extruder 1 in a mold, and is, for example, a plunger-type injection cylinder. 3 is a mold holder which moves straight left and right by a rail 9, and is equipped with a cooling jacket 8. 4 is a tablet mold, and is closed by an upper plunger 5 and a lower plunger 6. 10 is a tablet feeding mechanism.

For producing the resin tablet for semiconductor sealing by the production process of the present invention using the apparatus shown in FIG. 1, a resin composition is charged in a hopper (not shown) and is forwarded by an extruder screw to a heating cylinder of kneading extruder 1, where it is heated and kneaded usually at a temperature of about 60° to 150° C. The molten resin composition (clay-like or grease-like high viscous state) is introduced into resin feeder 2 (e.g., a plunger injection cylinder) and from there filled in tablet mold 4 beneath feeder 2. Completion of mold filling is monitored by detecting the injection pressure of the molten resin with, for example, a pressure sensor (e.g., a load cell) fitted to lower plunger 6. On receipt of the signal of mold filling completion, mold holder 3 moves right (or left) on rail 9 until the next tablet mold 4 comes right under feeder 2. The resin filled in the mold and moved right (or left) is press molded under a pressure of from about 50 to 300 kg/cm² between upper plunger 5 and lower plunger 6. During molding, cooling water set at 5° to 50° C. is circulated through cooling jacket 8 provided in mold holder 3. The resin is thus cooled to room temperature to about 60° C. and then ejected upward by lower plunger 6. The ejected molded article, i.e., a tablet is pressed forward by tablet feeding mechanism 10. On completion of filling of the left (or right) mold, the mold moves right (or left), and the above-described operation is repeated.

According to the process of the present invention, resin tablets having a compressibility of 98% or more and a metallic impurity content of less than 50 ppm can be produced with ease as demonstrated in Example 1 hereinafter described.

Figure 2:
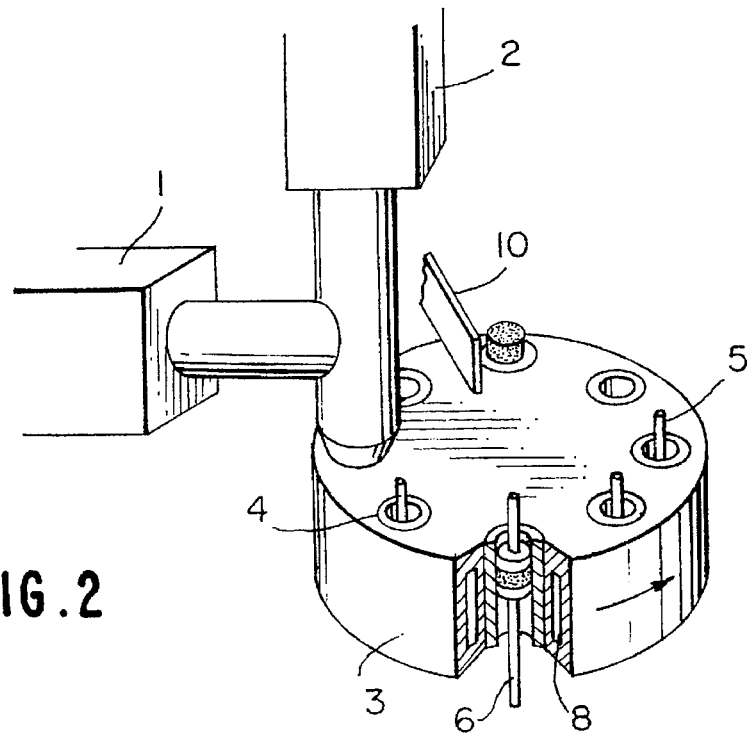

FIG. 2 shows another example of an apparatus used to produce the resin tablet for semiconductor sealing of the present invention.

In FIG. 2, 1 is a kneading extruder, and 2 is a resin feeder, such as a plunger injection cylinder. 3 is a turntable and a plurality of tablet molds 4 . . . are provided on the peripheral portion of the turntablet 3 at given intervals. 8 is a cooling jacket, 5 is an upper plunger, 6 is a lower plunger, and 10 is a scraper for feeding tablet.

For producing the tablet for semiconductor sealing of the present invention using the apparatus shwon in FIG. 2, a molten resin composition at 80° to 120° C. is fed from feeder 2 (e.g., a plunger injection cylinder) to one of the tablet molds kept at 40° C. right under feeder 2. On completion of mold filling, a signal is emitted from a pressure sensor, e.g., a load cell, in the same manner as with the apparatus of FIG. 1. On receipt of the signal, turntable 3 is rotated to the direction with an arrow until the next tablet mold kept at 40° C. comes right under feeder 2, and the molten resin is filled in this mold.

When the molten resin supply is cut, and turntable 3 is rotated, it is preferable to apply a back pressure to the resin so as to improve weight precision of tablets.

Immediately after the mold filled with the molten resin moves from the position beneath feeder 2, upper plunger 5 is inserted into mold 4, and both upper and lower plungers 5, 6 are synchronized with turntable 3. Meanwhile, the resin composition in mold 4 is pressed by upper and lower plungers 5, 6 at a pressure of from about 50 to 300 kg/cm² while being cooled with cooling water at 5° to 50° C. circulating in cooling jacket 8 provided in turntable 3. In front of scraper 10, the cooled and solidified tablet is ejected by lower plunger 6 and then removed from turntable 3 by scraper 10.

There are provided a plurality of pairs of upper and lower plungers 5, 6. Each time a molten resin composition is successively fed from feeder 2 and filled in tablet mold 4, a pair of upper and lower plungers 5, 6 is put in the above-described motion. Resin tablets are thus produced in a continuous manner.

In using the apparatus shown in FIG. 1 or 2, the production rate can be increased by speeding up of the movement of mold holder 3 or turntable 3 or by increasing the number of tablet molds 4 per turntable 3 and increasing the feed rate of the molten resin composition to each tablet mold 4.

Figure 3:
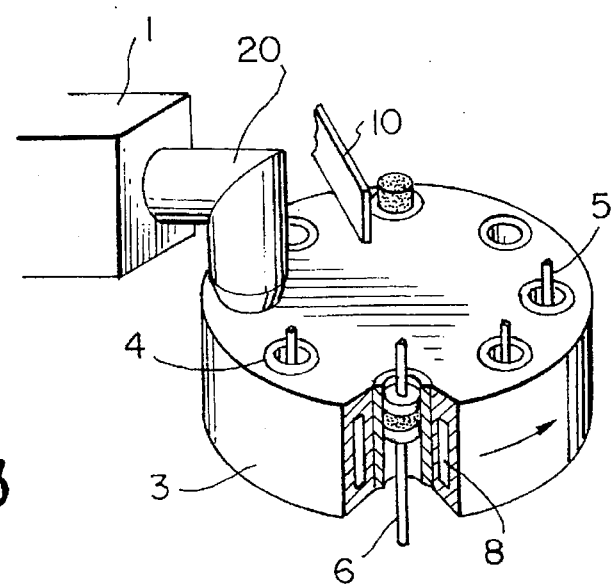

However, an injection cylinder working as resin feeder 2 has a limit of speed of its reciprocal motion. It is not so easy to increase the speed of injection cylinder 2 to follow the increased speed of kneading extruder 1. Therefore, in cases where a size of tablets as designed is relatively small so that a requisite feeding pressure is not so high, it is recommended to use a tableting machine as illustrated in FIG. 3, in which an injection cylinder is omitted and, instead, feed pipe 20 is connected to kneading extruder 1 so that the resin composition is directly fed from extruder 1 to tablet mold 4 by the extrusion force of extruder 1 while maintaining the resin composition in a molten state. The resin composition can be kept molten by adjusting the resin temperature passing through feed pipe 20 at 60° to 100° C.

Figure 4A:
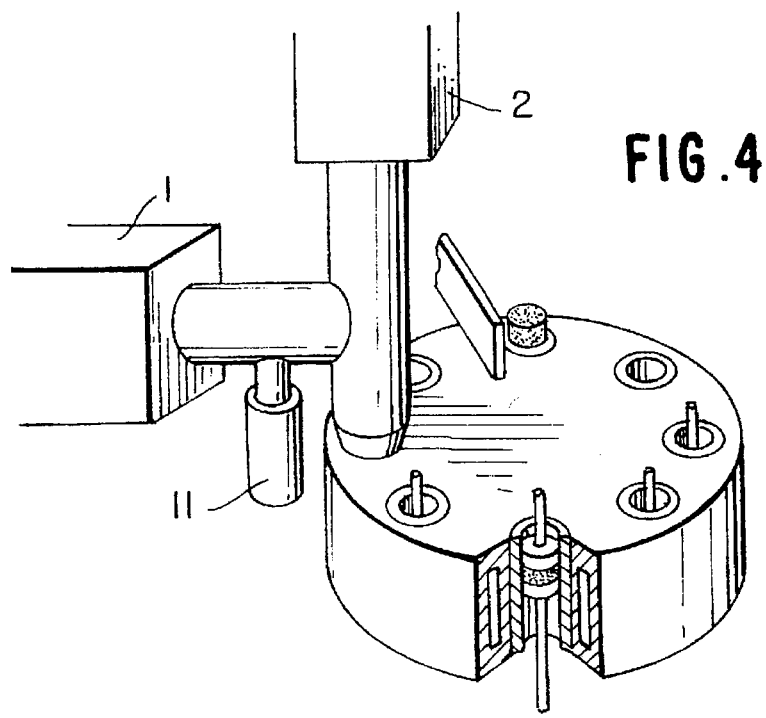
Figure 4B:
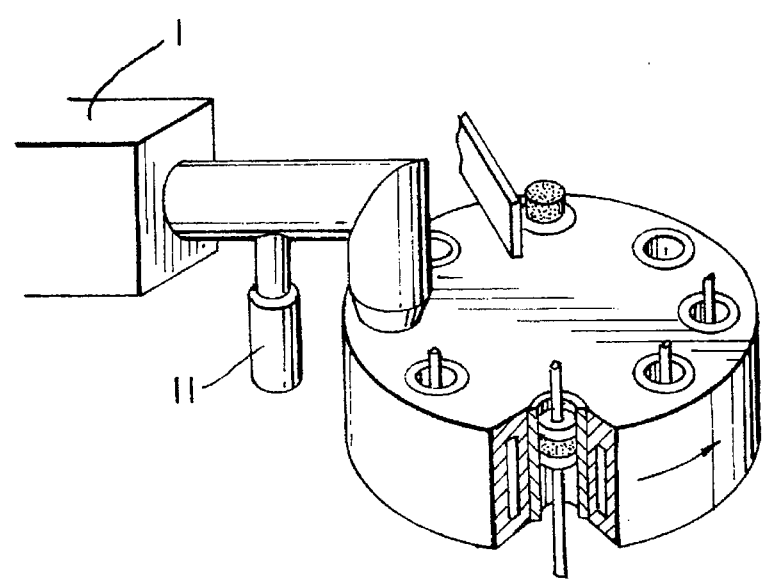

Since an injection cylinder is not used in the apparatus of FIG. 3, production speed can be greatly increased, and productivity can easily be controlled simply by adjustment of the kneading extruder as demonstrated in Example 2 hereinafter described.

Where the apparatus illustrated in FIG. 1, 2 or 3 is used for the production of resin tablets, the resin pressure during the whole mold filling time (i.e., a time period while the mold holder or turntable 3 is stopped and the molten resin composition is filled in mold 4) is stationary, but the resin pressure increases during the mold changing time subsequent to mold filling (i.e., a time period while resin feed is stopped and a next mold is moving to the position right under feeder 2 or feeding pipe 20). However, in order to stabilize the quality of resin tablets as semiconductor sealing compound, it is desirable to maintain the resin pressure constant throughout the overall operation, particularly for the production of tablets having an L/D ratio of 2 or greater. To this effect, it is recommended to provide shock absorber 11 at the outlet side of kneading extruder 1 as shown in FIGS. 4(a) and (b) to thereby maintain the molten resin feeding pressure constant.

In using, for example, an air cylinder as shock absorber 11, the air pressure may be set at or slightly above $P \times (R_2/R_1)^2$, wherein P is a stationary resin pressure; $R_1$ is an air cylinder diameter; and $R_2$ is a piston diameter.

Shock absorber 11 may be provided at any position between the outlet of kneading extruder 1 and tablet mold 4, but is preferably provided in the vicinity of the outlet of kneading extruder 1. The position and the way of setting (vertical, horizontal or tilted) of the shock absorber are appropriately selected taking care not to interfere with motions of other constituting members of the apparatus, for example, the upper plunger.

The present invention is now illustrated in greater detail with reference to Examples, but it should be understood that the present invention is not construed as being limited thereto. All the parts and percents are by weight unless otherwise specified.

EXAMPLE 1

A tableting machine shown in FIG. 1 was used. The tablet mold had an inner diameter of 13 mm and a height of 20 mm.

A mixture of 60 parts of an epoxy resin, 10 parts of a flame retardation assistant, 30 parts of a curing agent, 220 parts of a filler, 5 parts of a flame retarder, 1 part of a parting agent, 1 part of a pigment, 1 part of a curing accelerator, and 1 part of a surface treating agent was mixed in a Henschel mixer for 30 minutes. The mixture was supplied to a kneading extruder, and the resulting molten resin composition was injected into a tablet mold at a resin temperature of 100° C. and a mold temperature of 40° C. The resin composition was press molded under a pressure of 100 kg/cm$^2$ for 60–90 seconds while cooling, and the resulting tablet was ejected from the mold by the lower plunger.

All the resulting tablets had a compressibility between 98% and 100%, a metallic impurity content of less than 9 ppm, and a water content of less than 0.02%. The amount of fine powders of 250 mesh or smaller adhered onto the tablet was 0.001%.

EXAMPLE 2

Resin tablets for semiconductor sealing were produced by using the tableting machine shown in FIG. 3 with other conditions, such as resin composition formulation, size of tablet mold 4, conditions of preheating in a Henschel mixer, temperature of the cooling water, molding pressure, and so on being the same as those employed in Example 1. Turntable 3 had eight tablet molds 4 thereon. The molten resin composition from kneading extruder 1 was fed to tablet mold 4 by the extrusion force of extruder 1 via feed pipe 20 kept at 80° C.

As described above, as having a controlled metal impurity content below 50 ppm, the resin tablets according to the present invention cause no trouble of a radiofrequency induction heater due to sparking. Further, as having a compressibility of 98% or higher, the whole tablet has a stable dielectric constant and is therefore uniformly preheated by radiofrequency induction heating to have a uniform quantity of generated heat $\omega V^2 \epsilon \tan \delta$. As a result, transfer molding of the resulting tablet for sealing semiconductor chips can be carried out in a stable manner.

Further, with a low metallic impurity content reduced to such a low level of less than 50 ppm, corrosion of semiconductor chips which has been conventionally observed due to ionized metals can be completely avoided. Besides the low metallic impurity content, a low water content (less than 0.1% by weight) of the tablet contributes to prevention of ionization of metallic impurities and prevention of void formation during transfer molding. Reliability of the resulting semiconductor devices can thus be improved to a great extent.

Furthermore, since the tablet of the present invention has a smooth surface preferably with the amount of fine powders of 250 mesh or smaller adhered thereto being controlled below 0.05% by weight, it satisfies the latest requirements demanded for cleanliness of semiconductor sealing factories.

Furthermost, when the tablet of the present invention is transfer molded for sealing of semiconductor chips, the central portion of the tablet which tends to flow into a transfer cavity with a slight time lag has a gel time shorter than that of the outer surface portion, which leads to a reduction of transfer molding cycle.

The process according to the present invention makes it possible to produce resin tablets having the above-mentioned excellent characteristics. Where, in particular, a molten resin composition is fed by an extrusion force of a kneading extruder, the process is suitable for realization of high-speed production. Further, in this case, a resin feeder such as an injection cylinder can be omitted, which brings about easy mechanical matching of upper and lower plungers and a tablet mold and simplification of setting of the apparatus. Where the resin pressure is maintained constant by means of a shock absorber, quality of the resulting resin tablets for semiconductor sealing can be easily stabilized, and overloading of the kneading extruder can be prevented.

While the invention has been described in detail and with reference to specific examples thereof, it will be apparent to one skilled in the art that various changes and modifications can be made therein without departing from the spirit and scope thereof.

What is claimed is:

1. A process for producing a semiconductor device comprising sealing a semiconductor chip with a resin tablet having a compressibility of not less than 98% and a metallic impurity content of less than 50 ppm which is obtained by cooling and solidifying a molten resin composition, by transfer molding.

2. A process as claimed in claim 1, wherein the resin tablet comprises a resin composition comprising a resin, a filler and a curing agent.

3. A process as claimed in claim 1, wherein the resin composition is an epoxy resin composition.

4. A process as claimed in claim 1, wherein the resin tablet comprises less than 0.05% by weight, based on the entire weight of the tablet of fine powders adhered to said resin tablet, and wherein said fine powders have a mesh size of 250 or smaller.

5. A process as claimed in claim 1, wherein said tablet has a water content of less than 0.1% by weight.

6. A process as claimed in claim 1, wherein said tablet has an outer diameter of not more than 20 mm and a length to outer ratio of not less than 1.

7. A process as claimed in claim 1, wherein said tablet has an outer diameter of not less than 20 mm and a length to outer diameter ratio of not more than 1.

8. A process as claimed in claim 1, wherein said tablet is composed of a plurality of tablets, laminated by adhesion or fusion, each having an outer diameter of not less than 20 mm and a length to outer diameter ratio of not more than 1.

9. A process as claimed in claim 1, wherein said tablet is a hollow tablet having an outer diameter of not less than 20 mm and an inner diameter of not more than 20 mm, said outer diameter and said inner diameter not simultaneously being 20 mm.

* * * * *